United States Patent [19]
Klingman

[11] Patent Number: 5,337,403
[45] Date of Patent: Aug. 9, 1994

[54] DIGITAL SIGNAL PROCESSING METHOD AND APPARATUS INCLUDING A GRAPHIC TEMPLATE DISPLAY

[76] Inventor: Edwin E. Klingman, 3000 Hwy. 84, San Gregorio, Calif. 94074

[21] Appl. No.: 761,664

[22] Filed: Sep. 18, 1991

[51] Int. Cl.$^5$ ............................................. G06F 15/74
[52] U.S. Cl. ..................... 395/140; 395/148; 395/161
[58] Field of Search ............... 346/700; 395/140, 125, 395/148, 161; 324/73.1; 364/431.01; 375/114

[56] References Cited

U.S. PATENT DOCUMENTS

| | | | |
|---|---|---|---|
| 4,476,531 | 10/1984 | Marino et al. | 364/431.01 X |
| 4,809,189 | 2/1989 | Batson | 395/140 X |
| 4,812,996 | 3/1989 | Stubbs | 395/140 X |
| 4,908,786 | 3/1990 | Kuno et al. | 395/140 X |
| 4,974,177 | 11/1990 | Nishigushi | 395/125 X |
| 5,138,252 | 11/1992 | Ferguson | 395/140 X |
| 5,144,225 | 9/1992 | Talbot et al. | 324/73.1 X |

OTHER PUBLICATIONS

Intel; Product Specification; 8051 Single-Chip Microcomputer Architectural Specification and Functional Description, 1980.

(Author/Publisher unknown); Illustrated ISDN. Siemens, Product Literature regarding ISDN Subscriber Access Controller (ISACS-S); PEB 2085.

*Primary Examiner*—Gary V. Harkcom
*Assistant Examiner*—Cliff N. Vo
*Attorney, Agent, or Firm*—Claude A. S. Hamrick

[57] ABSTRACT

A digital signal processing apparatus including a graphic template display including an input circuit for sampling, digitizing and storing successive samples of an input signal, a signal processor for scaling the sampled signal data, a buffer for storing the scaled signals, a copy memory for storing a copy of the scaled signal data, a template memory for storing template data, an image retrieval circuit for accessing and reading out the stored signal and template data, a data mapping circuit for reformatting the stored image data, a display memory for holding the reformatted image data for cyclical display, a memory access circuit for accessing and combining the reformatted image data and the display memory data, and for providing the timing necessary for presentation of the combined data, and display apparatus for displaying the combined data in an original format.

15 Claims, 3 Drawing Sheets

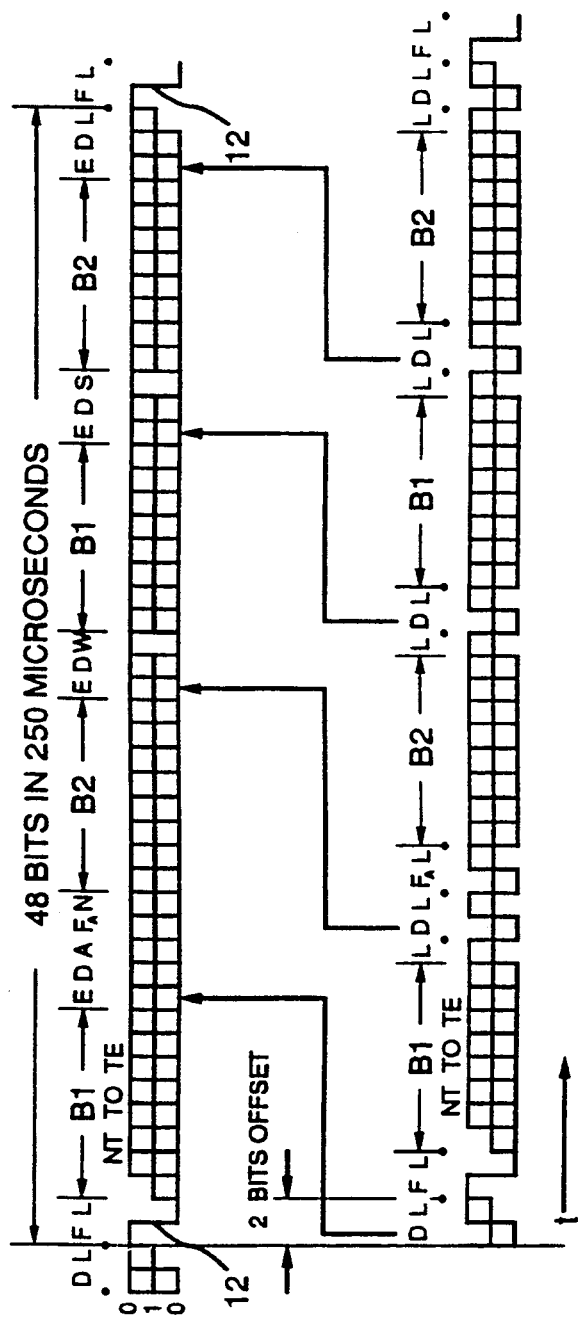

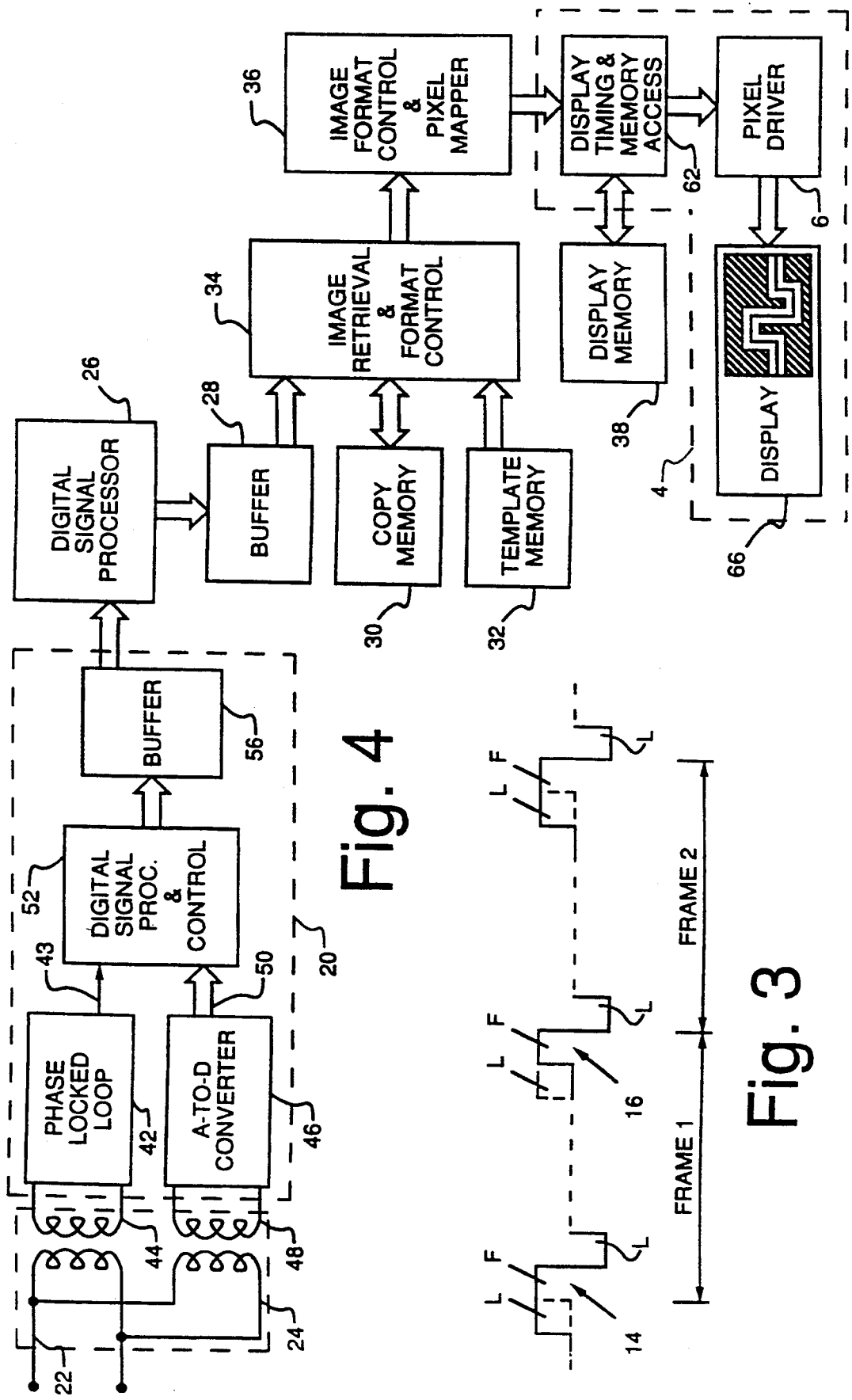

DIGITAL SIGNAL PROCESSING METHOD AND APPARATUS INCLUDING A GRAPHIC TEMPLATE DISPLAY

BACKGROUND OF THE INVENTION

1. Field of the Invention

The present invention relates generally to signal analyzing methods and apparatus and more particularly to an improved method and apparatus for acquiring, processing, and displaying in real time a continuously changing, periodically recurrent electronic signal. A specific example of a signal to be analyzed is the synchronizing "S" signal used in an ISDN communication network.

2. Brief Description of the Prior Art

In order to make a stream of analog or digital data intelligible, it is necessary that some type of reference component be inserted into the data stream so that it can be detected and then used as a benchmark from which to interpret the information content of the stream. A classical example of such a data stream in the analog domain is a television signal which includes sync pulses used to identify the start of each scan line. In the digital world, synchronizing frame bits are used to identify the beginning and ending of data words or frames containing a plurality of digital bits of data.

In communications networks, the accuracy and efficiency of the medium is directly related to the ability of the network to faithfully communicate the synchronizing signals. In an attempt to standardize digital communications links, media and interfaces, the CCITT, a communications standard group that is part of the United Nations, has defined a recommendation for a worldwide Integrated Services Digital Network (ISDN) capable of handling voice and data over copper wires, fiberoptics, satellite channels and other implementations of future technologies.

Because such a system must encompass high-level data such as video images, computer messages, voice communications, and other information, and must also specify low-level data concerning wires, connectors, frequencies, voltages, etc., the system has been designed in "layers" with the bottom layer (layer 1) representing the physical phenomenon, and the top layer (layer 7) representing user applications. In between are layers that partition the network in terms of well-defined interfaces that range from the interface at the bottom (physical) layer, over which physical signals are passed, up an increasingly abstract hierarchy to the most general, "application" layer which represents the user's desired task or application that makes use of the digital (ISDN) communications network. The CCITT layers are rigorously defined at the interfaces between layers, and the messages that flow between the layers are also specified.

It is important to note that the implementation of the layers is not specified, leaving complete freedom to the designer of the layered communication system. In use, messages flow down from the top layers to the physical layer, across the network, and up to the "peer" layer at the destination.

while the seven-layer scheme is designed to allow any computer to communicate with any other computer, regardless of make or manufacture, the top layers are not absolutely essential to successful communications across the network. The bottom three layers, i.e., the Physical (1), Data Link (2), and Network (3) layers, are essential, and must exist where any device or system is capable of communicating across the ISDN.

The ISDN network recommended by the CCITT committee uses a four-wire connection from the network to the subscriber defined as the "S" interface. The signals flowing between the Subscriber (S) and the Network Terminator (T) points are depicted in FIGS. 1 and 2 of the drawing.

According to the CCITT recommendation, and as particularly depicted in FIG. 1, a pseudo-ternary code with 100% pulse width is used on the "S" interface. An example of pseudo-ternary code is shown at 10. A logical 1 corresponds to a neutral level (no current), whereas logical O's are coded as alternating positive and negative pulses.

The frame structures of the signals flowing from network to subscriber, and from subscriber to network are shown in FIG. 2. One S-frame consists of 48 bits at a nominal bit rate of 192 kbps. Thus, each frame carries two octets of data corresponding to a first channel B1, two octets of data corresponding to a second channel B2, and four channel identifying D-bits, according to the B1+B2+D structure defined for the ISDN basic access (total useful data rate: 144 kbps). The start of a frame is marked using a code violation in the form of a framing bit "F" which, because of its shape, is referred to herein as the "S" bit or S-signal.

Signals such as the S-signal are sometimes defined using a template that delineates the allowed tolerance limits of the signal. Valid signals are those that fall within the limits imposed by the template. Although an acceptable S-signal shape may be defined by a "template" including framing limits that bracket the tolerance limits of the S-shaped pulses, most such pulses have heretofore been measured and displayed in terms of "eye" diagrams. This is partly due to the fact that since there is no CCITT-defined method of implementing the waveform; there is no standard way to synchronize to the S-signal for measurement purposes. However, from the Frame Structure diagram shown in FIG. 2, it can be determined that one of the 48 bits, i.e., the "F" bit 12, crossing the "S" interface every 250 microseconds (i.e. 8,000-48 bit frames/sec) has a defined transition, all other bit transitions depending on B-channel, D-channel, balance bits and other bits preceding the transition.

Because the frame balancing begins anew with each frame, the balance bit (L) that immediately follows the "high" frame sync bit (F) must be "low" to balance the DC charge build-up on the line. The voltage waveform at the framing bit, as received at the subscriber-receiver terminal, will therefore have the forms illustrated in FIG. 3. Note that on each side of the framing bit "F" a DC balancing bit "L" is depicted, the polarity of which will change dependent upon the data that appears in the D and B channels. If no data appears within the frames, the states of the balance bits will alternate, as depicted at 14 and 16, in order to maintain DC balance on the line. The alternating "fat top" "thin top" "fat top" . . . characteristic makes it difficult to use a simple oscilloscope-type technique to lock onto and display the condition of the framing bit, hence the prior art use of the "eye" diagram detectors.

SUMMARY OF THE PRESENT INVENTION

It is therefore a principal objective of the present invention to provide a method and apparatus for capturing, processing and dynamically displaying a periodically occurring data signal.

Another object of the present invention is to provide a device of the type described which enables a captured and processed signal to be dynamically displayed in a manner which provides a histogram of the signal.

Still another object of the present invention is to provide a method and apparatus of the type described particularly suited for capturing and processing the frame sync signal (S-signal) used in CCITT ISDN communication systems and displaying it in a manner which illustrates its historical variation over a selected period of time.

Briefly, a preferred embodiment of the present invention includes an input circuit for sampling, digitizing and storing successive samples of an input signal, a signal processor for scaling the sampled signal data, a buffer for storing the scaled signals, a copy memory for storing a copy of the scaled signal data, a template memory for storing template data, an image retrieval circuit for accessing and reading out the stored signal and template data, a data mapping circuit for reformatting the stored image data, a display memory for holding the reformatted image data for cyclical display, a memory access circuit for accessing and combining the reformatted image data and the display memory data, and for providing the timing necessary for presentation of the combined data, and display apparatus for displaying the combined data in an original format.

Among the numerous advantages of the present invention is that it provides a process and means for accurately depicting the dynamic variation of a selected time recurrent signal.

Another advantage of the present invention is that it provides an accurate visual display of the historical variation of a captured signal.

Still other advantages of the present invention derive from the fact that it provides a time-averaged record of complex signals, with reference to standardized signal criteria, in a format which combines the signal history with signal tolerance limits in a manner ideally suited to visual interpretation. All previous signal excursions out of the tolerance limits are visually depicted, as well as the extent of the excursion, over an arbitrary number signal cycles. Visual inspection of such a display immediately yields a measure of signal quality that exceeds in information content any single number resulting from mathematical computations or measurements.

These and other objects and advantages of the present invention will no doubt become apparent to those skilled in the art after having read the following detailed description of the preferred embodiment which is depicted in the several figures of the drawing.

IN THE DRAWING

FIG. 1 is a diagram illustrating a pseudo ternary code;

FIG. 2 is a diagram illustrating the frame structure of communications signals used in accordance with the ISDN communications network;

FIG. 3 is a diagram illustrating the form taken by three successive ISDN frame sync signals;

FIG. 4 is a block diagram illustrating a signal processing and display system in accordance with the present invention;

DETAILED DESCRIPTION OF THE PREFERRED EMBODIMENT

Figure 7:
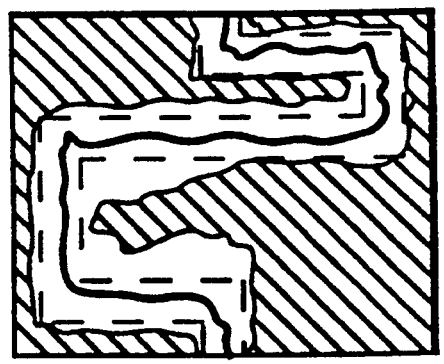
FIGS. 6 and 7 are diagrams illustrating the display of a sampled S-signal in accordance with the present invention.

Referring now to FIG. 4 of the drawing, a block diagram is set forth illustrating a preferred embodiment of the present invention. As depicted, the apparatus includes a signal acquisition and conversion circuit 20 for sampling, digitizing and storing successive samples of an input signal obtained from a communication line 22 via an "S" interface 24; a signal processor 26 for scaling the sampled signals; a buffer 28 for temporarily storing the scaled signal data; a copy memory 30 for storing a copy of the scaled signal data; a template memory 32 for storing template data; an image retrieval circuit 34 for accessing and reading out the stored signal and template data; a data mapping circuit 36 for reformatting the stored image data; a display memory 38 for holding the reformatted image data for cyclical display, and a display subsystem 40 for simultaneously displaying the template and signal data.

The circuit 20 is a signal acquisition and processing subsystem of the type described in my co-pending application Ser. No. 761,665 filed Sep. 18, 1991 (entitled ISDN "S" SIGNAL DETECTION AND DISPLAY APPARATUS), now U.S. Pat. No. 5,253,273 and expressly incorporated herein by reference. Generally speaking, the circuit 20 includes a phase-locked loop signal synchronizing circuit 42 that is coupled to the first secondary winding 44 of the "S" interface 24 and serves to generate at 43 a sync clock signal synchronized with the frame sync signal ("F", or "framing" or frame-sync bit) of an ISDN formatted communication signal input to the interface 24, an analog-to-digital signal sampling circuit 46 the input of which is connected to a second primary winding 48 of the interface 24 and is operative to develop at its output 50 a digitized signal corresponding to the data input through the interface 24, a digital signal processor and control circuit 52 that responds to the clock signal appearing at its input 43 and samples the frame sync signals input at 50, and then outputs the sampled information to a buffer 56.

In the preferred embodiment the unit 20 is implemented using a Siemens 2085 Sync Clock Generator; the unit 46 is implemented using an Analog Devices AD 521K Instrumentation Amplifier and AD 7569 Digital Converter; and the unit 52 is implemented using an Intel 8051 Digital Signal Processor. The buffer 56 is any suitable RAM memory buffer.

Figure 5:
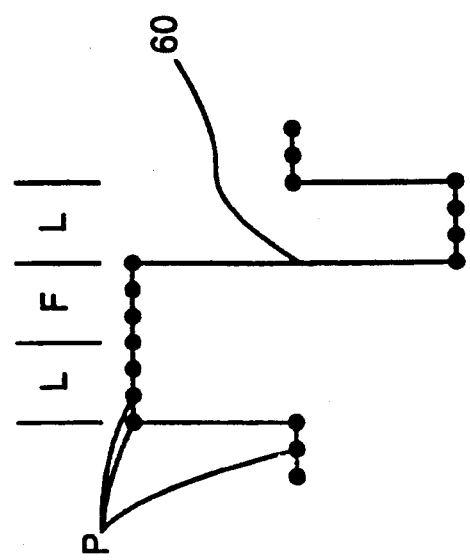
FIG. 5 is a diagram illustrating the sampling of an S-signal in accordance with the present invention.

As described in more detail in the above-identified co-pending application and as illustrated in FIG. 5, unit 52 samples the digitized S-signal data at a plurality of points "P" preceding and succeeding the "F"-bit transition 60, and stores the data corresponding to alternate frames in buffer 56. Signal processor 26 scales the sampled signals stored in buffer 56 and outputs the scaled data to the processed signal buffer 28.

The image retrieval and format controller 34 extracts the scaled data from buffer 28 and presents it to the image formatter and pixel mapper 36 wherein it is bit-mapped into a suitable form for bit map display. It also copies the bit-mapped image data into the copy memory 30, and on reset, copies the template data in memory 32 into display memory 38.

Display subsystem 40 is comprised of a display timing and memory access circuit 62 that simultaneously reads out the data stored in display memory 38 and presents it to pixel driver 64 which in turn drives corresponding pixel elements in the display 66.

Following each display, the signal data stored in copy memory 30 is retrieved, and each bit is inverted and written into display memory 38 over the data contained therein. The result is that, for all signal data points lying within the unmasked region of the mask data in memory 38, no data change occurs. However, data corresponding to each mask pixel in memory 38 that is overwritten by the signal data will have its state changed such that, on the next display of the data the overwritten mask portions will appear "eroded".

In the present invention, a Cybernetics CY275 System Controller, made by Cybernetics Micro Systems of San Gregorio, Calif., is used to implement the signal processor 26 and image retrieval and formal controller 34. A Cybernetics CY325 Image Processing Subsystem is used to implement the unit 36. Unit 62 is a Toshiba T6963A Image Control and Display Driver, unit 64 is a Toshiba T7778A LCD Pixel Voltage Driver, and unit 66 is an AND1021 or 711 LCD Graphic Display or equivalent.

In operation, the signal of interest is acquired via interface 24 and presented to the waveform sampling subsystem 20, sampled, and data corresponding to the sampled data points are stored in the sampled signal buffer 56. The signal processing and scaling subsystem 26 then accesses the data from the sampled signal buffer 56 and processes and scales the signal data appropriately, thereafter storing the scaled and processed waveform data in the processed signal buffer 28. The appropriate scaling brings the processed waveform into correspondence with the tolerance template stored in the template storage memory 32.

The image retrieval and format control subsystem 34 first accesses the template data in memory 32 and formats it for presentation to the image format and pixel mapper subsystem 36. The pixel mapper 36 then transforms the mask image data and presents it to the display timing and memory access subsystem 62 which in turn stores the mask image data in local display memory 38. Subsystem 34 then in turn retrieves the data corresponding to each processed waveform and formats it for presentation to the mapper subsystem 36. The mapper then transforms the waveform data and presents it to subsystem 62 for storage in display memory 38.

As indicated above, after each readout of the combined mask and waveform data from memory 38, and before the next waveform data is input to memory 38, the previous waveform data stored in the copy memory 30 is read out, inverted, mapped and input to memory 38 to accomplish the erosion operation previously mentioned.

The display driver circuits 64, under control of subsystem and in response to the data read out of memory 38, produce voltages necessary to control the pixels of the display subsystem 66.

Figure 6:
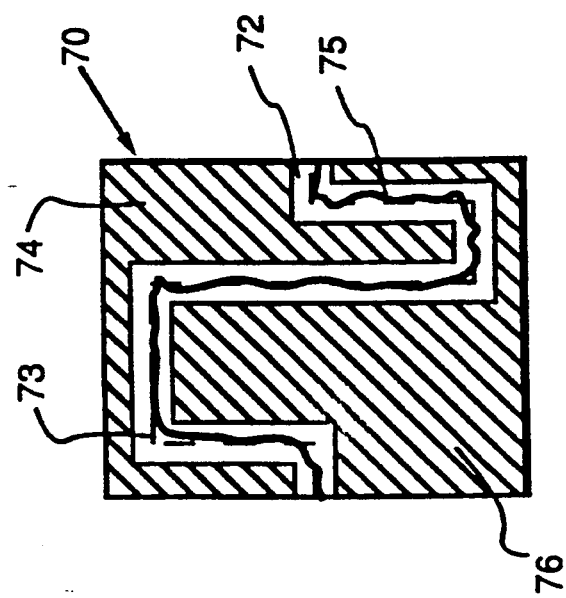

The image control subsystem is designed to present the image of the mask or template once, then to repeatedly present a sequence of acquired and processed waveforms together with the mask (as eroded) according to the following algorithm:

1) The mask image is written into memory 38 and read out for display on the display screen, as depicted at 70 in FIG. 6.
2) The newly acquired and processed waveform is then written into memory 38 and both mask and waveform data are read out to the display 66 where the waveform 73 (ideally) shows within the portion 72 of the display that is not masked. The visual appearance of an ideal waveform would be that of a signal, such as that indicated by dashed line 73, bounded above and below by forbidden regions 74 and 76 respectively. However, the actual signal waveform might be expected to look more like that indicated at 75.
3) The present signal waveform data is also copied into the secondary buffer (copy memory) 30 and held while a new signal image is acquired and processed.
4) An additional (optional) delay after step 3 may be required for visual purposes relating to the persistence of the image device and of human vision.
5) After the delay required by steps 3 and 4 above, the present signal waveform data is accessed from the buffer 30 into which it was copied in step 2 and each retrieved data bit is inverted in such a manner that, when written to the display memory 38, it exactly cancels, or erases, any data bit appearing in the corresponding pixel location, thereby causing not only the original signal trace to be erased in memory, but also any portion of the mask over which the trace was written.
6) The composite image is then read out of display memory 38 by unit 62 and used to actuate pixel driver 64 which in turn drives the display unit 66.
7) The display sequence is then repeated from step 2 above yielding a visual display that, as depicted in FIG. 7, appears as a continuously changing historical representation of the desired waveform. The change is due to additive noise imposed on an "ideal" signal. When the noise is such that the signal plus noise is within bounds, the signal lies entirely within the unmasked portion of the display. However, if the noise magnitude is such that the signal plus noise actually overwrites the masked (forbidden) region of the display, then the signal image will be masked or hidden since a dark pixel written over a dark pixel does not show. Note, however, that when the noisy signal is erased, the result is to turn the dark pixel light, and those signal pixels that overwrite masked pixels now become light. The visual effect is as shown in FIG. 7 and is that the mask or template appears to be "eroded" in the places where the noisy signal was out of bounds. This visual erosion of the mask is cumulative until the mask is refreshed, at which time the process begins again from step 1. The eroded template provides a very informative picture of the noise level and signal history.

Although the present invention has been described above in terms of a single preferred embodiment, it is anticipated that in view of this disclosure various alterations and modifications thereof will be apparent to those skilled in the art. It is therefore intended that the appended claims be interpreted as covering all such alterations and modifications as fall within the true spirit and scope of the invention.

What is claimed is:

1. Signal processing and display apparatus for monitoring repetitive signal pulses appearing in a stream of data, comprising:

signal acquisition means for detecting and digitizing said repetitive signal pulse to form digitized signal pulse data;

buffer means for temporarily storing said digitized signal pulse data;

template memory means for storing template data corresponding to a template in the form of a mask of one data state having a window area therein of a second data state, the borders of the window area defining acceptable tolerance limits for certain characteristics of said repetitive signal pulses;

display memory means;

image formatting said bit mapping means for retrieving said template data from said template memory means and for extracting said digitized signal pulse data from said buffer means, for bit mapping said template data and said digitized signal pulse data into a predetermined pixel array format, and for causing the bit mapped template data and bit mapped digitized signal pulse data to be stored in said display memory means; and display means for reading out the bit mapped template data and bit mapped digitized signal pulse data stored in said display memory means and for displaying the bit mapped template data and the bit mapped digitized signal pulse data in overlapping alignment to indicate the relationship between said repetitive signal pulses and said template.

2. Signal processing and display apparatus as recited in claim 1 and further comprising:

control means for causing said image formatting and bit mapping means to retrieve said template data from said template memory means, to bit map the retrieval template data and to store the bit mapped template data in said display memory means once during a selected period of time, and for causing said image formatting and bit mapping means to extract signal pulse data from said buffer means, to bit map the extracted signal pulse data, and to store in said display memory means a series of said extracted signal pulse data occurring during the selected period of time.

3. Signal processing and displaying apparatus as recited in claim 2 and further comprising:

copy memory means for storing a copy of the digitized signal pulse data extracted from said buffer means, and wherein following each display of the bit mapped template data and the bit mapped signal pulse data stored in said display memory means, said image formatting and bit mapping means retrieves the previously copied signal pulse data from said copy memory means, causes ti to be inverted, bit mapped, and then read into said display memory means over the bit mapped signal pulse data and bit mapped template data then contained therein such that the previously stored and displayed bit mapped signal pulse data and any overlaid bit mapped template data contained in said display memory means is cancelled, whereby upon the next display of bit mapped template data and bit mapped signal pulse data, the said borders of said template window area are eroded to the extent that they have been overlaid by preceding bit mapped signal pulse data occurring during said selected period of time.

4. Signal processing and display apparatus as recited in claim 3 wherein said signal acquisition means includes:

clock signal generating means for receiving said stream of data and generating a clock signal corresponding to each said repetitive signal pulse;

signal converter means for receiving said stream of data; and processor means responsive to said clock signal and operative to cause said signal converter means to sample said repetitive signal pulses at predetermined time intervals and to output a plurality of corresponding data point signals forming said digitized signal pulse data.

5. Signal processing and display apparatus as recited in claim 4 wherein said clock signal generating means includes a phase-locked loop circuit adapted to lock on to each said repetitive signal pulse and to generate a clock pulse corresponding thereto.

6. Signal processing and display apparatus as recited in claim 5 wherein said signal converter means includes an analog-to-digital converter for sampling and digitizing each said repetitive signal pulse to develop said data point signals.

7. Signal processing and display apparatus as recited in claim 6 wherein said signal converter means further includes amplifying means for amplifying said stream of data and for isolating said analog-to-digital converter from the source of such stream of data.

8. Signal processing and display apparatus as recited in claim 7 wherein said processor means is adapted to cause said converter means to sample said repetitive signal pulses in a manner such that said data point signals correspond to particular points in time immediately preceding and following each said clock signal.

9. Signal processing and display apparatus as recited in claim 4 and wherein said signal converter means includes an analog-to-digital converter for sampling and digitizing each said repetitive signal pulse to develop said data point signals.

10. Signal processing and display apparatus as recited in claim 9 wherein said signal converter means further includes amplifying means for amplifying said stream of data and for isolating said analog-to-digital converter from the source of such stream of data.

11. Signal processing and display apparatus as recited in claim 4 wherein said processor means is adapted to cause said converter means to sample said repetitive signal pulses in a manner such that said data point signals correspond to particular points in time immediately preceding and following each said clock signal.

12. Signal processing and display apparatus for monitoring a frame sync bit of an Integrated Services Digital Network communication signal, comprising:

signal acquisition means for connection to an "S" interface of an Integrated Services Digital Network communication network to receive communicated data signals and operative to detect and digitize at least a selected portion of selected data frames including said frame sync bit to form digitized signal pulse data;

buffer means for temporarily storing said digitized signal pulse data;

template memory means for storing template data corresponding to a template in the form of a mask of one data state having a window area therein of a second data state, the borders of the window area corresponding to acceptable tolerance limits of said frame sync bit;

display memory means;

image formatting and bit mapping means for retrieving said template data from said template memory means and for extracting said digitized signal pulse data from said buffer means, for bit mapping said template data and said digitized signal pulse data into a predetermined pixel array format, and for storing the bit mapped template data and bit mapped digitized signal pulse data in said display memory means; and display means for displaying the bit mapped template data and the bit mapped digitized signal pulse data in overlaying relationship to indicate the relationship between said frame sync bit and said template.

13. A method of detecting, processing and displaying a frame sync bit of a data frame of an Integrated Services Digital Network communication signal, comprising the steps of:

acquiring and digitizing a portion of communicated data frames including the sync bit to generate a signal pulse data corresponding thereto;

temporarily storing said signal pulse data;

providing a template data corresponding to a template in the form of a mask having a window area, the borders of the window area corresponding to the acceptable tolerance limits of said frame sync bit;

formatting and bit mapping said template data and the temporarily stored signal pulse data;

storing the bit mapped template data and the bit mapped signal pulse data in a display memory; and reading out and displaying the stored bit mapped template data and the bit mapped signal pulse data in overlaying relationship on a single display screen.

14. A method as recited in claim 13 wherein said bit mapped template data is stored in said display memory one time, and bit mapped signal pulse data corresponding to a series of subsequently occurring data frames is sequentially read into said display memory with each set of said bit mapped signal pulse data being combined with said bit mapped template data and successively displayed on said display screen.

15. A method as recited in claim 14 and further comprising the step of temporarily storing a copy of each current signal pulse data and, following each display of the contents of said display memory, inverting the temporarily stored signal pulse data and reading an inverted signal pulse data into said display memory to overlay and cancel the corresponding signal pulse data and any overlaid template data, whereby upon a next read-out of said display memory contents, said template appears to be eroded by previously overlaid signal pulse data.

* * * * *